(12) United States Patent
Seo et al.

(10) Patent No.: US 11,581,144 B2
(45) Date of Patent: Feb. 14, 2023

(54) MULTILAYER CAPACITOR AND BOARD HAVING THE SAME MOUNTED THEREON

(71) Applicant: SAMSUNG ELECTRO-MECHANICS CO., LTD., Suwon-si (KR)

(72) Inventors: Yo Han Seo, Suwon-si (KR); Min Hoe Kim, Suwon-si (KR); Jong Hyun Cho, Suwon-si (KR); Min Sung Song, Suwon-si (KR); Byung Kil Yun, Suwon-si (KR); Jung Wun Hwang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/527,577

(22) Filed: Nov. 16, 2021

(65) Prior Publication Data

US 2022/0189693 A1  Jun. 16, 2022

(30) Foreign Application Priority Data

Dec. 11, 2020  (KR) .......................... 10-2020-0173139

(51) Int. Cl.
| | |
|---|---|
| *H01G 4/12* | (2006.01) |
| *H01G 4/30* | (2006.01) |
| *H01G 4/248* | (2006.01) |
| *H05K 1/18* | (2006.01) |
| *H05K 1/11* | (2006.01) |
| *H01G 4/232* | (2006.01) |

(52) U.S. Cl.
CPC ........... *H01G 4/1227* (2013.01); *H01G 4/232* (2013.01); *H01G 4/248* (2013.01); *H01G 4/30* (2013.01); *H05K 1/111* (2013.01); *H05K 1/181* (2013.01); *H05K 2201/10015* (2013.01)

(58) Field of Classification Search
CPC ..................................................... H01G 4/1227
USPC ........................................................ 174/260
See application file for complete search history.

(56) References Cited

U.S. PATENT DOCUMENTS

| | | | | |
|---|---|---|---|---|
| 7,279,825 | B2 * | 10/2007 | Ifuku .................. | H01L 41/0815 310/358 |
| 10,468,186 | B2 * | 11/2019 | Shimada ............. | C04B 35/4682 |
| 11,124,456 | B2 * | 9/2021 | Cann .................. | C04B 35/4682 |
| 11,264,174 | B2 * | 3/2022 | Tsuru .................. | C04B 35/4682 |
| 2017/0152187 | A1 * | 6/2017 | Nagaoka ............. | C01G 23/006 |

(Continued)

FOREIGN PATENT DOCUMENTS

| | | |
|---|---|---|
| JP | 2009-71106 A | 4/2009 |
| KR | 10-1941092 B1 | 1/2019 |

*Primary Examiner* — Stanley Tso
(74) *Attorney, Agent, or Firm* — Morgan, Lewis & Bockius LLP

(57) ABSTRACT

A multilayer capacitor includes a body having a plurality of dielectric layers and first and second internal electrodes alternately disposed with the dielectric layers interposed therebetween, and further including an active region in which the first and second internal electrodes overlap each other, and upper and lower covers disposed above and below the active region, respectively; and first and second external electrodes disposed on the body to be connected to the first and second internal electrodes, respectively, wherein the upper and lower covers include barium titanate (BT, $BaTiO_3$) and Yttria-stabilized zirconia (YSZ).

18 Claims, 6 Drawing Sheets

(56) References Cited

U.S. PATENT DOCUMENTS

2017/0327425 A1 11/2017 Gong et al.
2019/0074138 A1* 3/2019 Song .................. H01G 4/008

* cited by examiner

MULTILAYER CAPACITOR AND BOARD
HAVING THE SAME MOUNTED THEREON

CROSS-REFERENCE TO RELATED
APPLICATION(S)

This application claims the benefit of priority to Korean Patent Application No. 10-2020-0173139 filed on Dec. 11, 2020 in the Korean Intellectual Property Office, the disclosure of which is incorporated herein by reference in its entirety.

TECHNICAL FIELD

The present disclosure relates to a multilayer capacitor and a board having the same mounted thereon.

BACKGROUND

A multilayer capacitor has been used in various electronic devices due to the small size and high capacity thereof.

Recently, with the rapid rise of eco-friendly vehicles and electrical vehicles, power driving systems have increasingly been provided in vehicles, and accordingly, demand for a multilayer capacitor necessary for vehicles has also increased.

To be used as a component of a vehicle, high levels of thermal reliability, electrical reliability, and mechanical reliability may be necessary, and thus, the degree of performance necessary for a multilayer capacitor has also been gradually advanced.

One of the mechanical properties may be bending strength. When bending strength is weak, bending cracks may be formed through a multilayer capacitor by stress applied to the multilayer capacitor when the multilayer capacitor is mounted and pressed.

The bending cracks may cause disconnection of an internal electrode, which may cause product defects lowering capacity of the product.

SUMMARY

An aspect of the present disclosure is to provide a multilayer capacitor having improved bending strength and a board having the same mounted thereon.

According to an aspect of the present disclosure, a multilayer capacitor includes a body including a plurality of dielectric layers and first and second internal electrodes alternately disposed with the dielectric layers interposed therebetween, and further including an active region in which the first and second internal electrodes overlap each other, and upper and lower covers disposed above and below the active region, respectively; and first and second external electrodes disposed on the body to be connected to the first and second internal electrodes, respectively, wherein the upper and lower covers include barium titanate (BT, $BaTiO_3$) and Yttria-stabilized zirconia (YSZ).

YSZ may partially have a tetragonal phase.

In the body, a composition of the active region may be different from a composition of the upper and lower cover regions.

The active region may include BT and may not include YSZ.

The upper and lower covers may include 0.5 to 10 parts by weight of YSZ based on 100 parts by weight of BT.

In the upper and lower covers, a size of YSZ may be in a range from 5% to 25% of a size of BT.

A total thickness of the upper and lower covers may be in a range from 10% to 40% of a total thickness of the body.

The body may include first and second surfaces opposing each other in a first direction, third and fourth surfaces opposing each other in a second direction perpendicular to the first direction, and fifth and sixth surfaces opposing each other in a third direction perpendicular to the first direction, the first and second internal electrodes are alternately disposed in the first direction, and the first and second external electrodes are disposed on the third and fourth surfaces of the body, respectively.

The first and second external electrodes may include first and second connection portions disposed on the third and fourth surfaces of the body, respectively; and first and second band portions extending from the first and second connection portions to a portion of the first surface of the body, respectively.

According to an aspect of the present disclosure, a board on which the multilayer capacitor is mounted includes a board having first and second electrode pads on one surface; and a multilayer capacitor, wherein first and second external electrodes of the multilayer capacitor are mounted to be connected to the first and second electrode pads, respectively.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
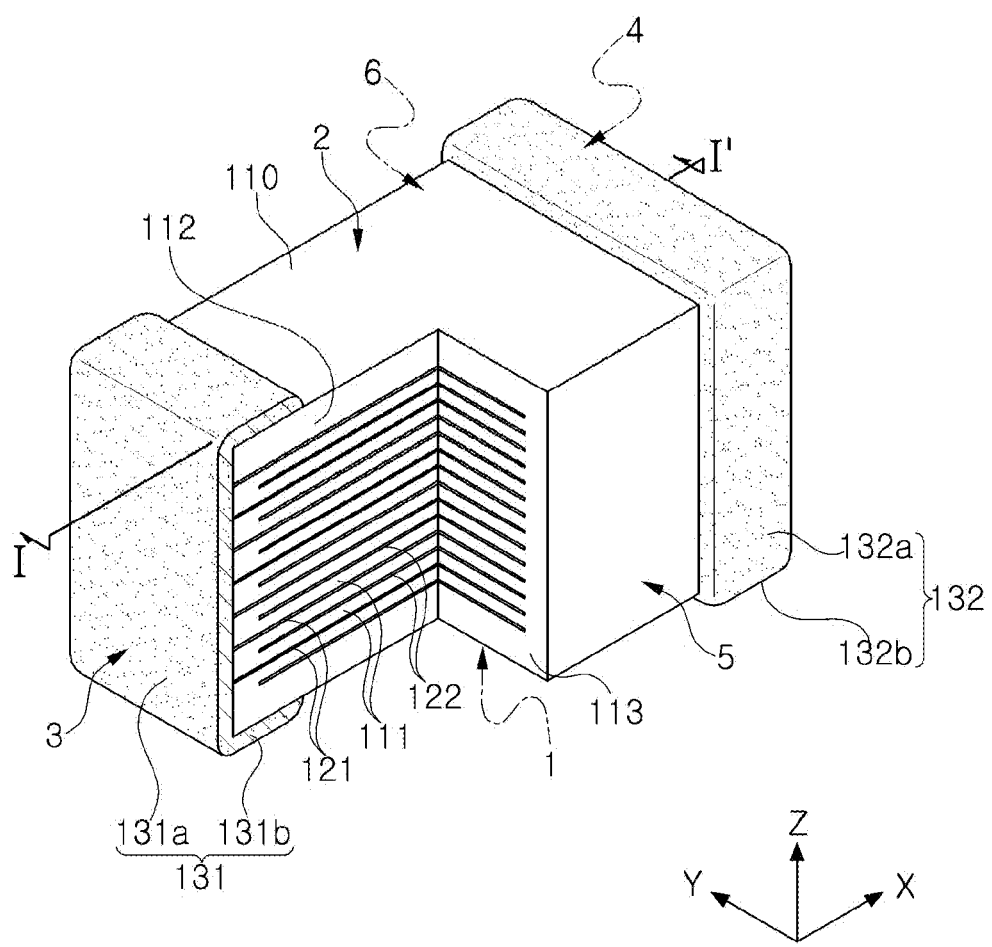
FIG. 1 is a perspective diagram illustrating a multilayer capacitor according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein.

Rather, these embodiments are provided such that this disclosure will be thorough and complete, and will fully convey the scope of the disclosure to those skilled in the art.

Shapes and sizes of elements in the drawings may be exaggerated for clarity of description, and elements indicated by the same reference numeral are same elements in the drawings.

Also, it will be understood that when a portion "includes" an element, it may further include another element, not excluding another element, unless otherwise indicated.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

The contents of the present disclosure described below may have a variety of configurations and propose only a required configuration herein, but are not limited thereto.

Figure 2A:
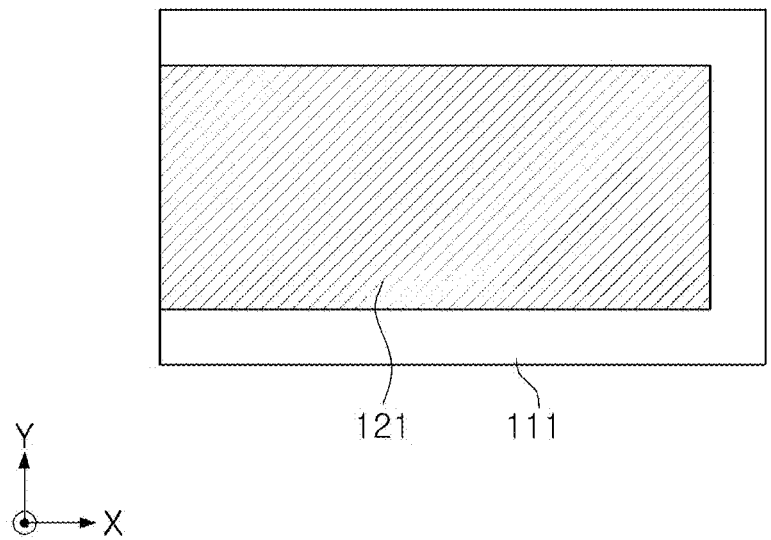
FIGS. 2A and 2B are plan diagrams illustrating structures of first and second internal electrodes illustrated in FIG. 1.
Figure 2B:
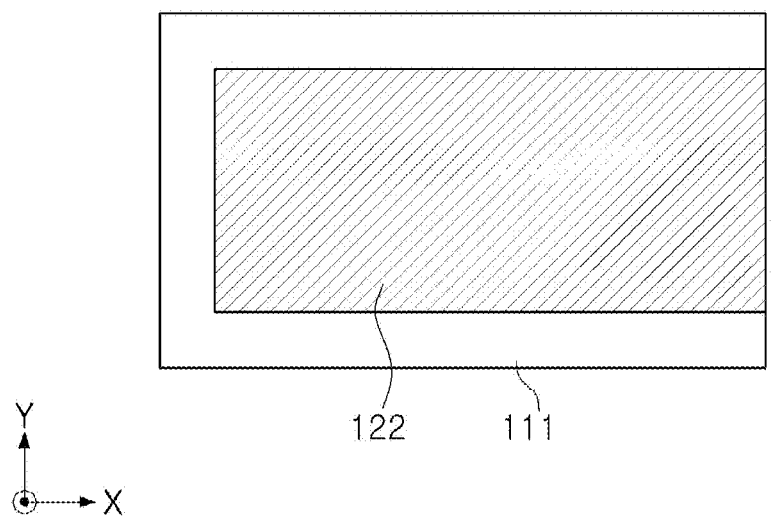
Figure 3:
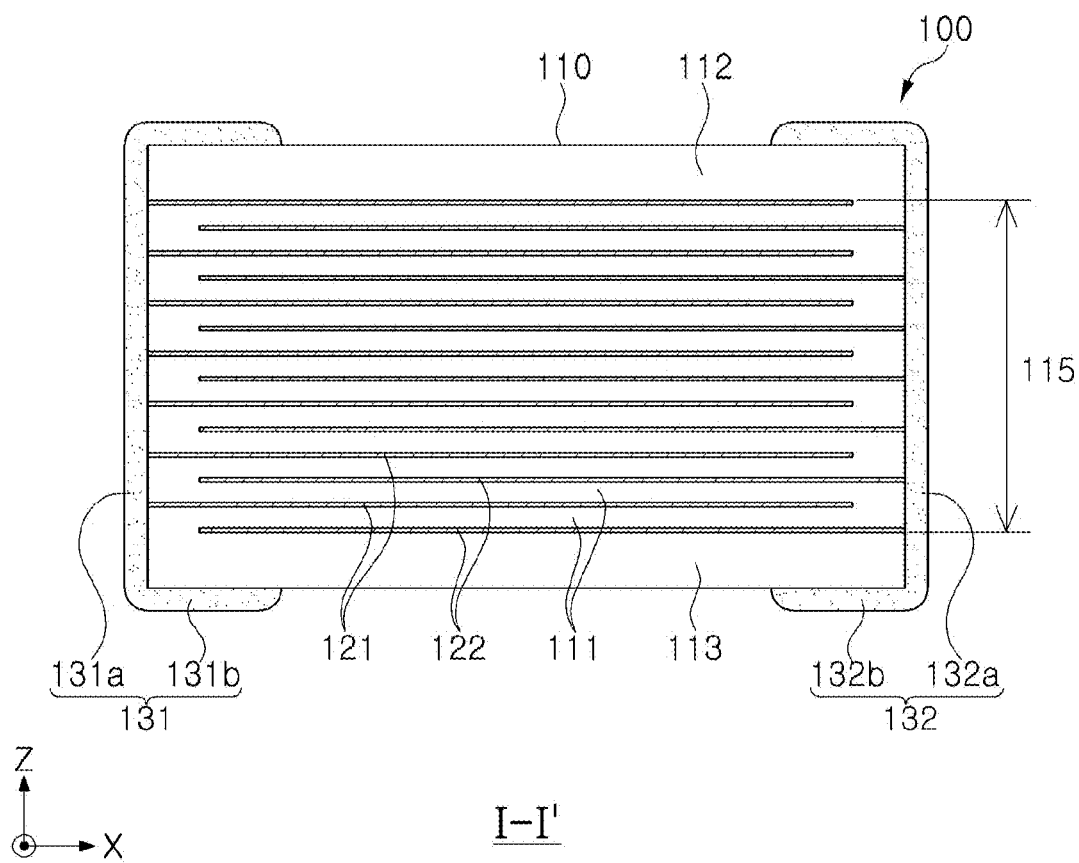
FIG. 3 is a cross-sectional diagram taken along line I-I' in FIG. 1.

Referring to FIGS. 1 to 3, a multilayer capacitor 100 according to an example embodiment may include a body 110 and first and second external electrodes 131 and 132.

As for the direction of the body 110, X, Y, and Z in the drawings represent a length direction, a width direction, and a thickness direction, respectively.

The thickness direction may be used as the lamination direction in which the dielectric layers 111 are laminated.

The body 110 may have a substantially hexahedral shape, but an example embodiment thereof is not limited thereto.

In the example embodiment, both surfaces of the body 110 opposing each other in the Z direction in which the dielectric layers 111 are laminated may be defined as first and second surfaces 1 and 2, both surfaces connecting the first and second surfaces 1 and 2 to each other and opposing each other in the X direction may be defined as third and fourth surfaces 3 and 4, and both surfaces intersecting the above surfaces and opposing each other in the Y direction may be defined as fifth and sixth surfaces 5 and 6.

The body 110 may include an active region 115 and cover regions 112 and 113.

The active region may contribute to the formation of capacitance of the multilayer capacitor, and in the active region, the plurality of dielectric layers 111 may be laminated, and the first and second internal electrodes 121 and 122 may be alternately laminated in the Z direction with the dielectric layer 111 interposed therebetween.

The upper cover 112 may be a portion formed to have a predetermined thickness on the upper surface of the first internal electrode 121 disposed on an uppermost portion of the active region 115 as illustrated in the drawings, and the lower cover 113 may be a portion formed to have a predetermined thickness on the lower surface of the second internal electrode 122 disposed on a lowermost portion of the active region 115.

In the example embodiment, the upper cover 112 and the lower cover 113 may be formed of a dielectric material having a different composition from that of the dielectric layer 111 included in the active region 115.

In this case, the total thickness of the upper and lower covers 112 and 113 may be in a range from 10% to 40% of the total thickness of the body 110.

The dielectric layer 111 of the active region 115 may include the dielectric powder described herein and may be sintered, and boundaries between the dielectric layers 111 adjacent to each other may be integrated such that it may be difficult to identify the boundaries without using a scanning electron microscope (SEM).

The first and second internal electrodes 121 and 122 may have different polarities, and may be disposed to oppose each other in the lamination direction of the dielectric layer 111, and may be insulated from each other by the dielectric layer 111 interposed therebetween.

One end of the first and second internal electrodes 121 and 122 may be exposed through the third and fourth surfaces 3 and 4 of the body 110, respectively.

The ends of the first and second internal electrodes 121 and 122 exposed through the third and fourth surfaces 3 and 4 of the body 110 may be electrically connected to the first and second external electrodes 131 and 132 disposed on the third and fourth surfaces 3 and 4 of the body 110, respectively.

When a predetermined voltage is applied to the first and second external electrodes 131 and 132, electrical charges may be accumulated between the first and second internal electrodes 121 and 122 opposing each other.

In this case, capacitance of the multilayer capacitor 100 may be proportional to a region of overlap between the first and second internal electrodes 121 and 122, overlapping each other in the Z direction in the active region.

The first and second internal electrodes 121 and 122 may be formed of a conductive metal, such as, for example, nickel (Ni) or a nickel (Ni) alloy, but an example embodiment thereof is not limited thereto.

Also, as the method of printing the conductive paste, a screen-printing method or a gravure printing method may be used, and an example embodiment thereof is not limited thereto.

The first and second external electrodes 131 and 132 may include first and second connection portions 131a and 132a, and first and second band portions 131b and 132b, respectively.

The first and second connection portions 131a and 132a may be disposed on the third and fourth surfaces 3 and 4 of the body 110, respectively, and may be in contact with and electrically connected to the exposed portions of the first and second internal electrodes 121 and 122, respectively.

The first and second band portions 131b and 132b may extend from the first and second connection portions 131a and 132a to a portion of the first surface 1 of the body 110, respectively.

In this case, to improve fixing strength, the first and second band portions 131b and 132b may further extend to a portion of the second surface 2 of the body 110 and portions of the fifth and sixth surfaces 5 and 6 in the first and second connection portions 131a and 132a.

The first and second external electrodes 131 and 132 may be formed of a conductive paste including a conductive metal.

The conductive metal may be nickel (Ni), copper (Cu), palladium (Pd), gold (Au), or an alloy thereof, but an example embodiment thereof is not limited thereto.

The first and second external electrodes 131 and 132 may further include a plating layer (not illustrated) using nickel (Ni) or tin (Sn) on the surface thereof if desired.

As a method of improving bending strength of a general multilayer capacitor, a method of laminating two multilayer capacitors and connecting external electrodes to each other using a metal frame may be used such that the capacitor may be configured as a single device. As another method, a method of applying a conductive resin layer to the external electrode may be used.

However, the above two methods may be used to relieve the stress received by the multilayer capacitor, and when the multilayer capacitor receives additional stress of a certain level or more, the body may not withstand the stress and bending cracks may be formed.

Also, when a metal frame is used, the size of the electronic component may increase by the size of the metal frame.

Mechanical strength may be a factor affecting bending strength properties of a multilayer capacitor.

When the board on which the multilayer capacitor is mounted is pressed, stress according to the bending of the board may be applied to a chip, and the stress may be maximized on the end of the band portion, and cracks may be formed from small defects in the band portion.

That is, one method for minimizing the cracks may be to increase the mechanical strength near the end of the band portion in which stress is concentrated in the multilayer capacitor.

To this end, in the example embodiment, a BT-YSZ synthetic material in which Yttria-stabilized zirconia (YSZ) nanoparticles are mixed with a barium titanate (BT, $BaTiO_3$) matrix may be applied to the upper and lower covers.

In this case, the upper and lower covers 112 and 113 may include 0.5 to 10 parts by weight of YSZ based on 100 parts by weight of BT.

Figure 5A:
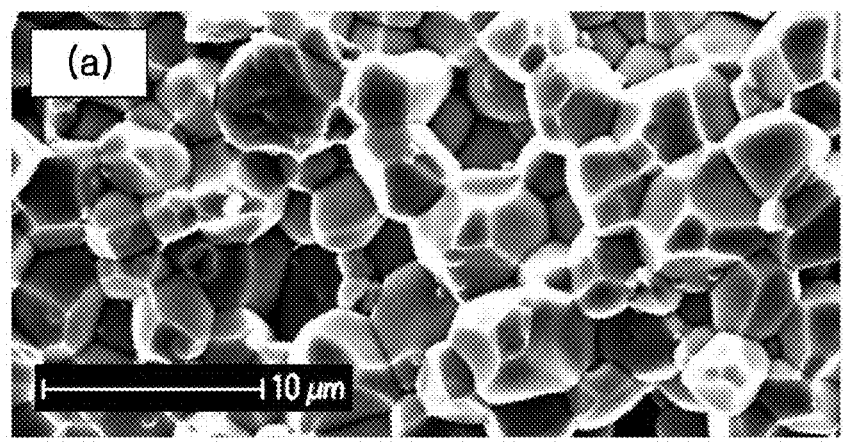
FIGS. 5A and 5B are SEM images of fracture surfaces of BT ceramic in an active region and a BT-YSZ composite in a cover, respectively.
Figure 5B:
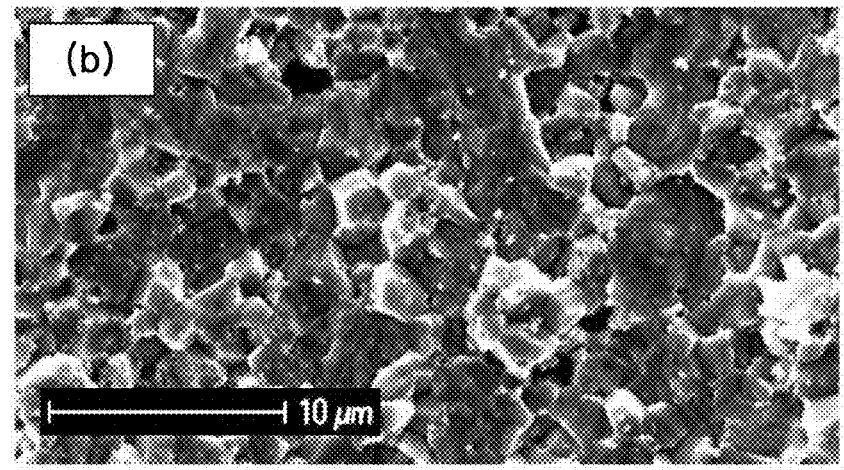

FIGS. 5A and 5B are SEM images of microstructures of fracture surfaces of BT ceramic in an active region and a BT-YSZ composite in a cover, respectively, taken at magnifications of 20,000 times to 50,000 times. As in FIGS. 5A and 5B, in the upper and lower covers 112 and 113, the particle size of YSZ may be 5 to 25% of the particle size of BT. The particle size of YSZ, as used herein, refers to an average value of a diameter of YSZ which is in BT grain as illustrated in FIG. 5B. BT particle size, as used herein, refers to an average of a diameter of BT grains. Thus, in an example, if the average diameter of YSZ is 20 nm and average diameter of BT is 200 nm, the particle size of YSZ is 10% of the particle size of BT grain.

For measuring the particle size of YSZ, the center of the multilayer capacitor taken in the X direction was cut out, and the fracture surface formed parallel to the YZ surface was imaged, where the particle size of YSZ was measured with respect to the image obtained for the points at which the cover of the fracture surface is cut by three portions in the Y direction, and an average value thereof was obtained.

The BT-YSZ composite material may have a mixture structure in which $ZrO_2$ nanoparticles are dispersed in a BT dielectric matrix.

The included $ZrO_2$ particles may be oxide particles having a size of several tens of nanometers containing about 3 mol % of $Y_2O_3$ and partially stabilized as a tetragonal phase.

BT dielectric ceramic may vary depending on the additive and sintering temperature, and a bending strength thereof may be about 30-80 MPa, whereas the $ZrO_2$ particles may have a bending strength of about 1,200 MPa, which is high, when sintered.

Figure 4:
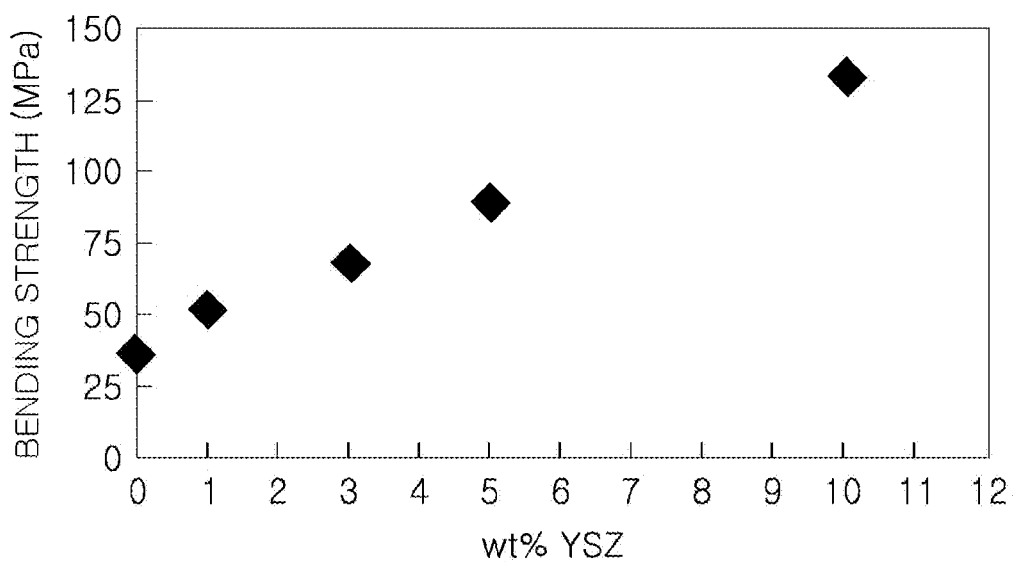
FIG. 4 is a graph illustrating three-point bending strength of a BT-YSZ composite depending on the content of YSZ.

Therefore, as illustrated in FIG. 4, as for a composite material in which $ZrO_2$ particles are added to BT, the bending strength may increase up to about 125 MPa depending on the content of YSZ, such that it may be expected that, when manufacturing the multilayer capacitor, the bending strength properties may be higher than that of a dielectric ceramic material formed of only BT.

Also, as for YSZ, since the sintering temperature is 1,300° C. or higher, which is higher than that of BT, when BT and YSZ are mixed and sintered, a composite mostly remaining as a secondary phase may be obtained, and the BT-YSZ mixture material may have increased mechanical properties such as an increased elastic modulus, an increased Young's modulus, and improved bending strength.

Therefore, as for the multilayer capacitor in the example embodiment in which the BT-YSZ composite material is applied to the upper and lower covers, the bending strength of the multilayer capacitor may improve as compared to a general multilayer capacitor in which the upper and lower covers are formed only of BT, and accordingly, bending cracks may be significantly reduced or prevented.

When the BT-YSZ composite material is sintered at 1,200° C. or higher, $ZrO_2$, the tetragonal phase, may be partially diffused into the BT grains, and thus, the effect of doping Zr in the BT dielectric may appear.

When the effect of doping Zr in the BT dielectric appears, changes in the characteristics of the dielectric may be induced in the active region. To prevent the above issue, in the example embodiment, the BT-YSZ structure may be applied only to the upper and lower covers, and the active region may be implemented only by BT, without including YSZ.

Figure 6:
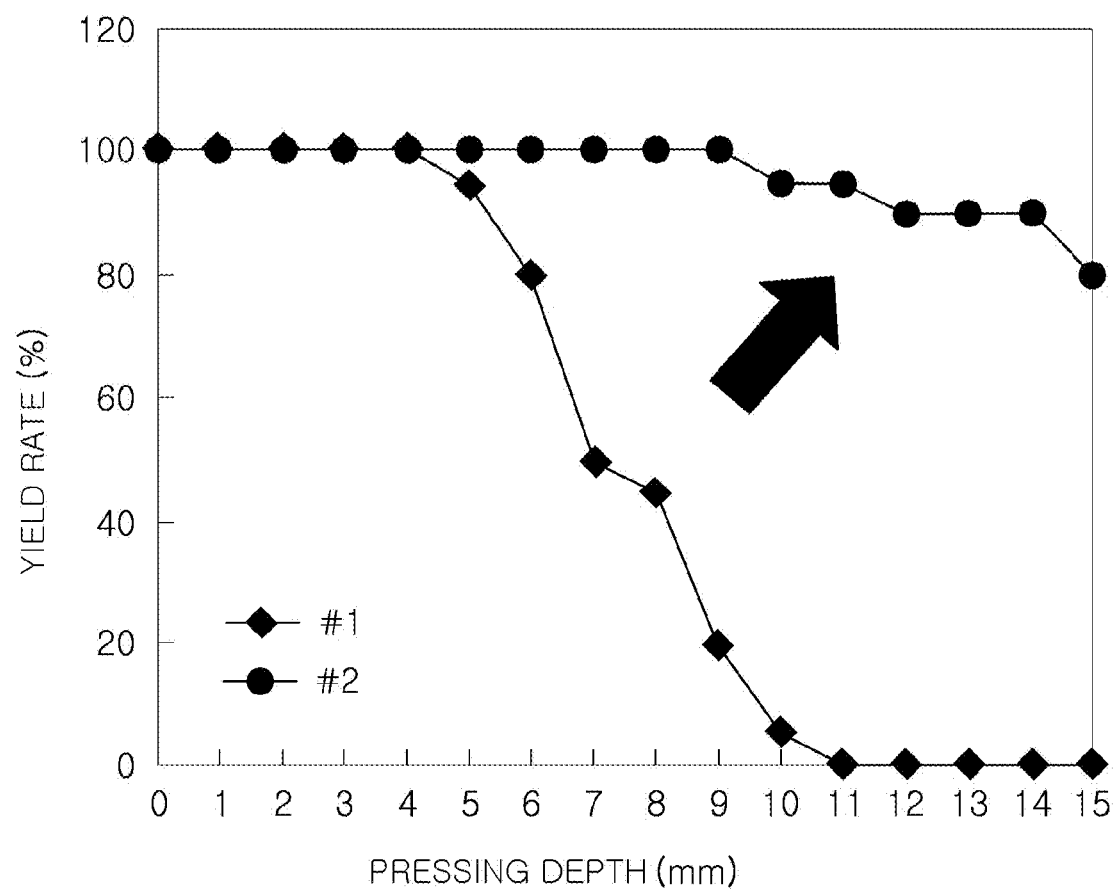
FIG. 6 is graphs illustrating a survival rate depending on a pressing depth in a comparative example in which an active region and a cover are formed of BT and in a multilayer capacitor of an example embodiment of the present disclosure.

FIG. 6 is a graph illustrating a comparison between results of a warpage test of the multilayer capacitor having the structure in an example embodiment and a general multilayer capacitor.

Comparative Example (#1) had a structure in which an active region and a cover are formed of the same BT, and Embodiment (#2) was a multilayer capacitor having a structure in which upper and lower covers are formed of a BT-YSZ composite material.

In this case, the multilayer capacitor used for each sample had a length of 1.6 mm in an X direction, a length of 0.8 mm in a Y direction, and electrical properties of 2.2 µF.

In the case of embodiment, YSZ of 3 parts by weight was added to the upper and lower covers, based on 100 parts by weight of BT.

Each of the multilayer capacitors was mounted on a PCB, a pressing depth of the board was increased by 1 mm each time, and it was observed as to whether cracks were formed in the multilayer capacitor, and the results were listed in FIG. 6.

Referring to FIG. 6, in the comparative example, cracks started to form when the pressing depth was 5 mm, and when the pressing depth exceeded 10 mm, the survival rate was close to 0%, such that, when the pressing depth exceeded 11 mm, the survival rate was 0%. As used herein the term "survival rate" refers to a % of capacitors tested that did not have cracks during the warpage test as described herein.

In one example, the survival rate is determined as follows: the capacitor chip is mounted on the PCB board. The PCB board is suitable connected for performing capacitance measurements. The board is then pressed using a customized round tip. The resultant bending of the board causes the capacitance of the capacitor chip to change. The capacitance, in some instances, my reduce drastically at certain pressing depths because of occurrence of a crack. In such instances, the capacitor is shorted, or may be termed as being "dead." Survival rate is, thus, the ratio of the number of capacitors that survive to the number of total capacitors tested.

Thus, in FIG. 6, in case #1, the total number of capacitors tested is 20. If pressing depth is 4 mm, there is no crack in any of the capacitors. However, at a 5 mm pressing depth, one of the tested capacitors is dead, resulting in a survival rate of 95%. On the other hand, at a pressing depth of 6 mm, 4 capacitors are dead, resulting in a survival rate of 80%.

In the embodiment, the survival rate was 99% or more up to a pressing depth of 9 mm, and even when the pressing length was 10 mm, the survival rate was 95%, and even when the pressing depth exceeded 11 mm, the survival rate did not rapidly decrease as in the comparative example.

Therefore, it may be confirmed that, as in the example embodiment, when the BT-YSZ composite material is applied to the upper and lower covers, the bending strength properties of the multilayer capacitor may improve.

Figure 7:
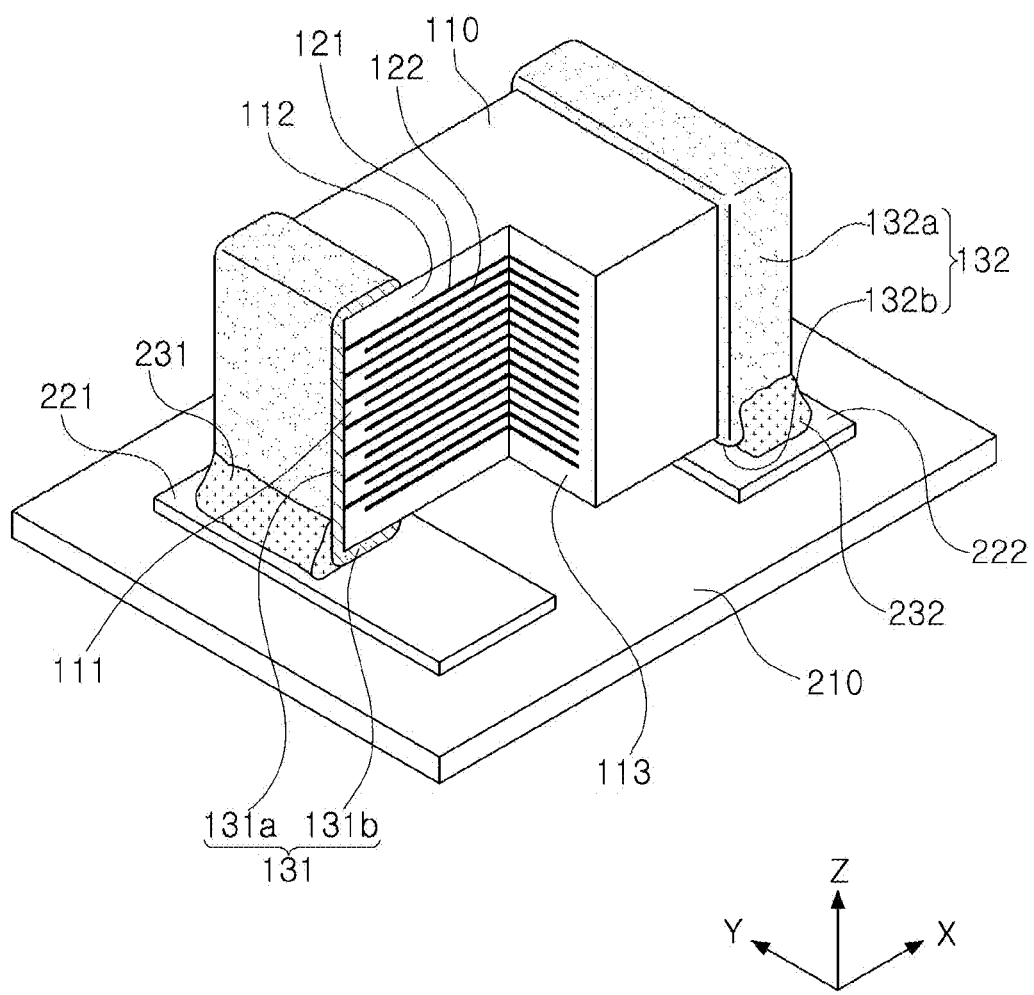
FIG. 7 is a perspective diagram illustrating a state in which the multilayer capacitor in FIG. 1 is mounted on a board.

FIG. 7 is a perspective diagram illustrating a state in which the multilayer capacitor in FIG. 1 is mounted on a board.

Referring to FIG. 7, the board on which the multilayer capacitor is mounted in an example embodiment may include a board 210 on which the multilayer capacitor 100 is mounted, and first and second electrode pads 221 and 222 formed to be spaced apart from each other on the upper surface of the board 210.

The multilayer capacitor 100 may be electrically connected to the board 210 by solder 231 and 232 while the first and second external electrodes 131 and 132 are disposed on and in contact with the first and second electrode pads 221 and 222.

In this case, in the multilayer capacitor 100, to implement the effect of improving the bending strength, the first and second internal electrodes 121 and 122 may be horizontally disposed with respect to the board 210 as in the example embodiment.

Here, the multilayer ceramic capacitor 100 is the multilayer ceramic capacitor described in the example embodiment described above, and a detailed description thereof will not be provided to avoid overlap.

According to the aforementioned example embodiment, by applying a composite material in which BT and YSZ are mixed to the cover, the bending strength of the multilayer capacitor may improve.

While the example embodiments have been illustrated and described above, it will be apparent to those skilled in the art that modifications and variations could be made without departing from the scope in the example embodiment as defined by the appended claims.

What is claimed is:

1. A multilayer capacitor, comprising:
a body including a plurality of dielectric layers and first and second internal electrodes alternately disposed with the dielectric layers interposed therebetween, and further including an active region in which the first and second internal electrodes overlap each other, and upper and lower covers disposed above and below the active region, respectively; and
first and second external electrodes disposed on the body to be connected to the first and second internal electrodes, respectively,
wherein the upper and lower covers include barium titanate (BT, $BaTiO_3$) and Yttria-stabilized zirconia (YSZ).

2. The multilayer capacitor of claim 1, wherein YSZ partially has a tetragonal phase.

3. The multilayer capacitor of claim 1, wherein, in the body, a composition of the active region is different from a composition of the upper and lower cover regions.

4. The multilayer capacitor of claim 3, wherein the active region includes BT and does not include YSZ.

5. The multilayer capacitor of claim 1, wherein the upper and lower covers include 0.5 to 10 parts by weight of YSZ based on 100 parts by weight of BT.

6. The multilayer capacitor of claim 1, wherein, in the upper and lower covers, a particle size of YSZ is in a range from 5% to 25% of a particle size of BT.

7. The multilayer capacitor of claim 1, wherein a total thickness of the upper and lower covers is in a range from 10% to 40% of a total thickness of the body.

8. The multilayer capacitor of claim 1,
wherein the upper and lower covers include 0.5 to 10 parts by weight of YSZ based on 100 parts by weight of BT, and
wherein, in the upper and lower covers, a particle size of YSZ is in a range from 5% to 25% of a particle size of BT.

9. The multilayer capacitor of claim 1,
wherein the upper and lower covers include 0.5 to 10 parts by weight of YSZ based on 100 parts by weight of BT, and
wherein a total thickness of the upper and lower covers is in a range from 10% to 40% of a total thickness of the body.

10. The multilayer capacitor of claim 1,
wherein, in the upper and lower covers, a particle size of YSZ is in a range from 5% to 25% of a particle size of BT, and
wherein a total thickness of the upper and lower covers is in a range from 10% to 40% of a total thickness of the body.

11. The multilayer capacitor of claim 1,
wherein the upper and lower covers include 0.5 to 10 parts by weight of YSZ based on 100 parts by weight of BT,
wherein, in the upper and lower covers, a particle size of YSZ is in a range from 5% to 25% of a particle size of BT, and
wherein a total thickness of the upper and lower covers is in a range from 10% to 40% of a total thickness of the body.

12. The multilayer capacitor of claim 1,
wherein the body includes first and second surfaces opposing each other in a first direction, third and fourth surfaces opposing each other in a second direction perpendicular to the first direction, and fifth and sixth surfaces opposing each other in a third direction perpendicular to the first direction,
wherein the first and second internal electrodes are alternately disposed in the first direction, and
wherein the first and second external electrodes are disposed on the third and fourth surfaces of the body, respectively.

13. The multilayer capacitor of claim 12, wherein the first and second external electrodes include first and second connection portions disposed on the third and fourth surfaces of the body, respectively; and first and second band portions extending from the first and second connection portions to a portion of the first surface of the body, respectively.

14. A board on which the multilayer capacitor is mounted, the board comprising:
a board having first and second electrode pads on one surface; and
a multilayer capacitor of claim 1;
wherein first and second external electrodes of the multilayer capacitor are mounted to be connected to the first and second electrode pads, respectively.

15. A multilayer capacitor, comprising:
a capacitance forming portion including internal electrodes disposed to overlap each other in stacking direction; and
upper and lower cover portions disposed above and below the capacitance forming portion in the stacking direction, the upper and lower cover portions comprising barium titanate (BT, $BaTiO_3$) and Yttria-stabilized zirconia (YSZ).

16. The multilayer capacitor of claim 15, wherein the internal electrodes are separated by a dielectric layer disposed between adjacent internal electrodes.

17. The multilayer capacitor of claim 16, wherein the dielectric layer comprises a dielectric material without YSZ, and is different from that of the upper and lower cover portions.

18. The multilayer capacitor of claim 15, wherein a total thickness of the upper and lower cover portions is in a range from 10% to 40% of a combined thickness of the capacitance forming portion and the upper and lower cover portions.

* * * * *